United States Patent
Bragin et al.

(10) Patent No.: US 6,757,315 B1
(45) Date of Patent: Jun. 29, 2004

(54) CORONA PREIONIZATION ASSEMBLY FOR A GAS LASER

(75) Inventors: Igor Bragin, Goettingen (DE); Vadim Berger, Goettingen (DE); Ivan Tassy-Julien, Göttingen (DE); Uwe Stamm, Goettingen (DE)

(73) Assignee: Lambda Physik AG, Goettingen (DE)

( * ) Notice: Subject to any disclaimer, the term of this patent is extended or adjusted under 35 U.S.C. 154(b) by 8 days.

(21) Appl. No.: 09/692,265

(22) Filed: Oct. 19, 2000

Related U.S. Application Data

(63) Continuation-in-part of application No. 09/247,887, filed on Feb. 10, 1999
(60) Provisional application No. 60/162,845, filed on Nov. 1, 1999, and provisional application No. 60/160,182, filed on Oct. 19, 1999.

(51) Int. Cl.$^7$ .............................. H01S 3/22; H01S 3/097
(52) U.S. Cl. ............................ 372/57; 372/82; 372/86; 372/87
(58) Field of Search ............................ 372/57, 86, 87, 372/82, 65, 55

(56) References Cited

U.S. PATENT DOCUMENTS

| | | | |
|---|---|---|---|
| 4,041,414 A | * 8/1977 | Richardson et al. | 372/86 |
| 4,105,952 A | 8/1978 | Tulip | 331/94.5 PE |
| 4,240,044 A | 12/1980 | Fahlen et al. | 331/94.5 PE |
| 4,287,483 A | 9/1981 | Rudko et al. | 331/94.5 |
| 4,365,337 A | 12/1982 | Cirkey et al. | 372/87 |
| 4,380,079 A | 4/1983 | Cohn et al. | 372/87 |
| 4,429,392 A | 1/1984 | Yoshida et al. | 372/9 |
| 4,491,949 A | 1/1985 | Beck et al. | 372/86 |
| 4,498,183 A | 2/1985 | Levatter | 372/86 |
| 4,507,266 A | * 3/1985 | Satoh et al. | 422/186.15 |
| 4,542,529 A | * 9/1985 | Pace et al. | 372/86 |
| 4,613,971 A | 9/1986 | Brumme et al. | 372/87 |

(List continued on next page.)

FOREIGN PATENT DOCUMENTS

| | | | |
|---|---|---|---|
| DE | 2050 490 | 4/1972 | D01H/1/10 |
| DE | 29 32 781 | 2/1981 | H01S/3/097 |
| DE | 30 35730 A1 | 5/1982 | H01S/3/03 |
| DE | 30 35 730 A1 | 5/1982 | H01S/3/03 |
| DE | 33 13811 A1 | 10/1984 | H01S/3/097 |
| DE | 295 21572 U1 | 11/1997 | H01S/3/038 |
| EP | 0 532 751 A1 | 2/1991 | |
| EP | 0 426 993 B1 | 12/1993 | H01S/3/038 |
| EP | 1 075 059 A1 | 2/2001 | H01S/3/0971 |
| EP | 1 107 401 A1 | 6/2001 | H01S/3/038 |
| JP | 63-86593 | 4/1988 | H01S/3/134 |
| JP | 3-9582 | 6/1989 | |

OTHER PUBLICATIONS

A.S. Bashkin, et al., "High Power 1 μsec Ultraviolet Radiation Source for Pumping of Gas Lasers," *Sov. J. of Quantum Electronics*, vol. 6, No. 8, Aug. 1976, pp. 994–996.

(List continued on next page.)

*Primary Examiner*—Paul Ip
*Assistant Examiner*—Armando Rodriguez
(74) *Attorney, Agent, or Firm*—Stallman & Pollock LLP

(57) ABSTRACT

A preionization device for a gas laser includes an internal preionization electrode having a dielectric housing around it such that the preionization device is of corona type. The internal electrode connects to advantageous electrical circuitry, preferably external to the discharge chamber via a conductive feedthrough. The circuitry reduces the voltage across the dielectric tube of the preionization unit to reduce over-flashing at tube ends and oscillations due to residual energies stored in the dielectric. A semi-transparent mesh electrode between the preionization unit and the discharge area prevents field distortions and discharge instabilities.

50 Claims, 5 Drawing Sheets

U.S. PATENT DOCUMENTS

| | | | | |
|---|---|---|---|---|
| 4,679,203 A | * | 7/1987 | Taylor et al. | 372/86 |
| 4,718,072 A | | 1/1988 | Marchetti et al. | 372/86 |
| 4,719,637 A | | 1/1988 | Cavaioli et al. | 372/59 |
| 4,823,354 A | | 4/1989 | Znotins et al. | 372/59 |
| 4,953,174 A | | 8/1990 | Eldridge et al. | 372/87 |
| 4,975,921 A | | 12/1990 | Rothe | 372/38 |
| 5,042,047 A | | 8/1991 | Ono et al. | 372/86 |
| 5,048,045 A | | 9/1991 | Noda et al. | 372/86 |
| 5,081,638 A | | 1/1992 | Gallant et al. | 372/86 |
| 5,090,020 A | | 2/1992 | Bedwell | 372/59 |
| 5,138,622 A | | 8/1992 | Friede et al. | 372/38 |
| 5,138,627 A | | 8/1992 | Friede et al. | 372/86 |
| 5,142,166 A | | 8/1992 | Birx | 307/419 |
| 5,187,716 A | | 2/1993 | Haruta et al. | 372/57 |
| 5,225,884 A | | 7/1993 | Stark et al. | 356/73 |
| 5,247,391 A | | 9/1993 | Gormley | 359/601 |
| 5,247,531 A | * | 9/1993 | Muller-Horsche | 372/38 |
| 5,247,534 A | | 9/1993 | Muller-Horsche | 372/58 |
| 5,247,535 A | | 9/1993 | Muller-Horsche et al. | 372/86 |
| 5,267,253 A | | 11/1993 | Nakatani | 372/38 |
| 5,305,339 A | | 4/1994 | Nakatani et al. | 372/38 |
| 5,309,462 A | | 5/1994 | Taylor et al. | 372/38 |
| 5,337,330 A | * | 8/1994 | Larson | 372/86 |
| 5,347,531 A | | 9/1994 | Nakatani et al. | 372/86 |
| 5,708,676 A | | 1/1998 | Minamitani et al. | 372/86 |
| 5,818,865 A | | 10/1998 | Watson et al. | 372/86 |
| 5,852,621 A | | 12/1998 | Sandstrom | 372/65 |
| 5,875,207 A | | 2/1999 | Osmanow | 372/86 |
| 5,897,847 A | | 4/1999 | Jursich et al. | 423/219 |
| 5,923,693 A | | 7/1999 | Ohmi et al. | 372/57 |
| 5,970,082 A | | 10/1999 | Ershov | 372/102 |
| 5,991,324 A | * | 11/1999 | Knowles et al. | 372/57 |
| 6,005,880 A | | 12/1999 | Basting et al. | 372/38 |
| 6,021,150 A | | 2/2000 | Partio et al. | 372/57 |
| 6,023,486 A | | 2/2000 | Hofmann et al. | 372/58 |
| 6,026,103 A | | 2/2000 | Oliver et al. | 372/37 |
| 6,028,872 A | | 2/2000 | Partio et al. | 372/38 |
| 6,028,880 A | | 2/2000 | Carlesi et al. | 372/58 |
| 6,034,978 A | | 3/2000 | Ujazdowski et al. | 372/34 |
| 6,034,984 A | | 3/2000 | Hofmann et al. | 372/58 |
| 6,240,110 B1 | | 5/2001 | Ershov | 372/20 |
| 6,456,643 B1 | | 9/2002 | Osmanow et al. | 372/86 |
| 2001/0036216 A1 | | 11/2001 | Bragin et al. | 372/55 |
| 2002/0041615 A1 | | 4/2002 | Borisov et al. | 372/57 |

OTHER PUBLICATIONS

K. Hohla, et al., "CIF and F2: Two–ultraviolet Laser Systems," *Optics and Laser Technology,* Dec. 1979, vol. 11, No. 6., pp. 281–328.

R. Marchetti et al., "A New Type of Corona–discharge Photoionization Source for Gas Lasers," *Journal of Applied Physics,* Dec. 31, 1985, vol. 56, No. 11., pp. 3163–3168.

R.S. Taylor et al., "Pre–ionization of a Long Optical Pulse Magnetic–spike Sustainer XeCl Laser," *Review of Scientific Instruments, American Institute of Physics,* Dec. 1994, vol. 65, No. 12, pp. 3621–3627.

Tatsuo Enami et al., "High Spectral Purity and High Durability kHz KrF Excimer Laser with Advanced RF Pre–ionization Discharge," *Proceedings of SPIE, Optical Microlithography XI,* Feb. 25–27, 1998, vol. 3334, pp. 1031–1040.

Article in Russian Language: Journal of Technical Physics, vol. 49, No. 6, pp. 1241–1244.

Lambda Physik Booklet: "Instruction for Mounting the Brewster's Window EMG 67 or Unstable Resonator Kit EMG 70," printed 1/82, 27 pages.

Raymond A. DeCarlo, Linear Circuit Analysis, Chapter 9: Second–Order Linear Circuits, pp. 258.

U.S. patent application Ser. No. 09/247,887, Igor Bragin, et al., filed Feb. 10, 1999.

* cited by examiner

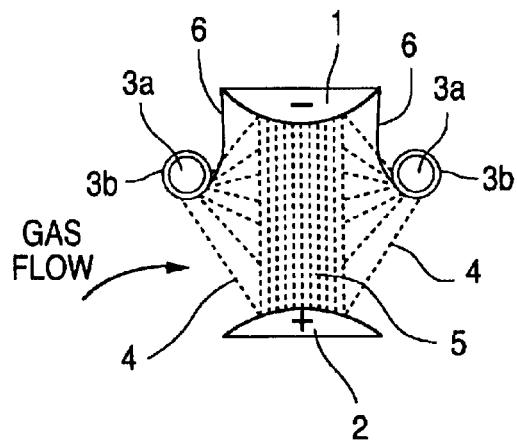
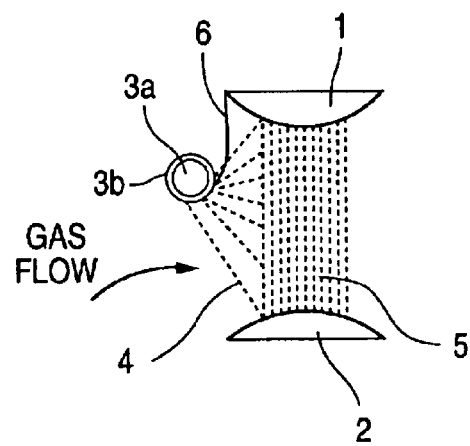
FIG. 1a
(PRIOR ART)
FIG. 1b
(PRIOR ART)
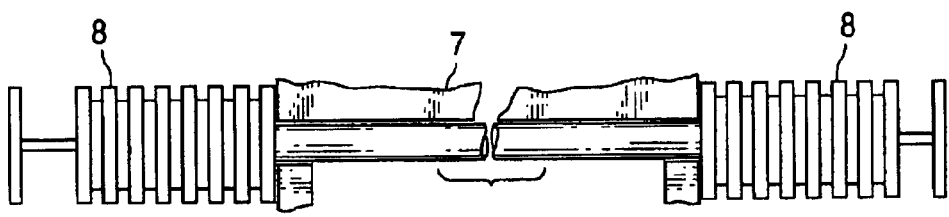
FIG. 1c
(PRIOR ART)
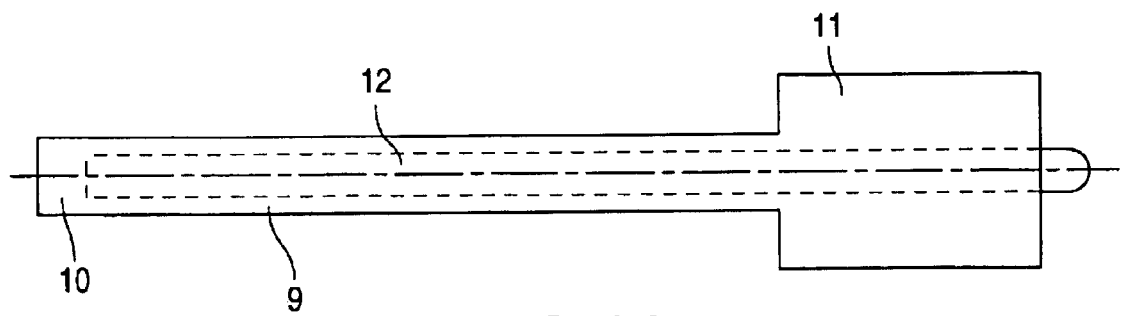
FIG. 1d

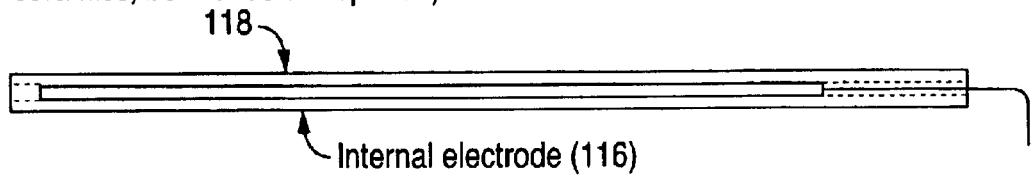
FIG. 4
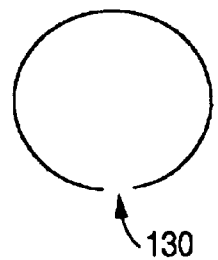 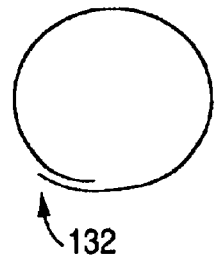
Fig. 5a  Fig. 5b
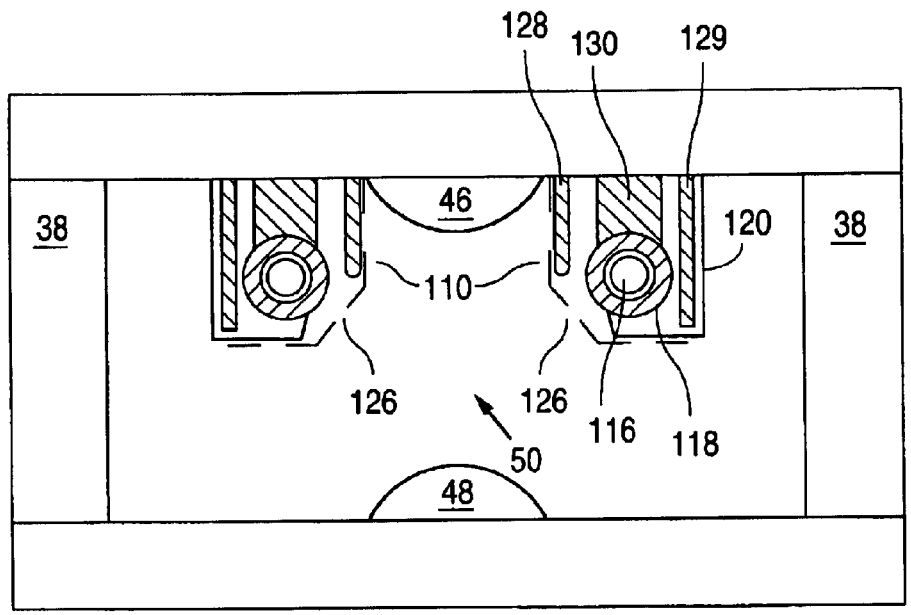
FIG. 6

CORONA PREIONIZATION ASSEMBLY FOR A GAS LASER

PRIORITY

This application claims the benefit of priority to U.S. provisional patent applications No. 60/162,845, filed Nov. 1, 1999, and No. 60/160,182, filed Oct. 19, 1999, and this application is a continuation-in-part of U.S. patent application Ser. No. 09/247,887, now issued as U.S. Pat. No. 6,650,679, filed Feb. 10, 1999, each application of which is hereby incorporated by reference into this application.

BACKGROUND OF THE INVENTION

1. Field of the Invention

The invention relates to an gas laser pumped by an electrical gas discharge, and particularly to a corona-type preionization device and technique for generating a stable pulsed gas discharge for pumping of an active medium of an excimer or molecular fluorine gas discharge laser.

2. Discussion of the Related Art

UV-preionization of an electrical discharge in a pulsed gas laser is typically realized by means of an array of spark gaps or by another source of UV-radiation (surface, barrier or corona gas discharges), disposed in the vicinity of at least one of the solid electrodes of the main discharge of the laser. Early on in the development of excimer lasers (e.g., KrF, ArF, XeCl, XeF, etc.), conventional pulsed electrical gas discharges typically used for pumping the active media exhibited a high degree of instability. The development of discharge instabilities causes the glow discharge, a precondition for laser emission, to have a short phase (e.g., having a typical duration from 10–100 ns) and to thus be terminated more quickly than is preferred. The desired way of generating a high quality gas discharge for use in excimer and molecular lasers, including the molecular fluorine ($F_2$) laser, is to provide an intense, yet uniform preionization of the gas volume before the main gas discharge occurs.

One way of providing this preionization is by photo-ionizing the laser gas with UV-light emitted from an auxiliary gas discharge before the main gas discharge is switched on. Some known methods of preionizing high pressure gas lasers include x-ray, spark and corona-gap preionization. See R. S. Taylor and K. E. Leopold, Pre-preionization of a Long Optical Pulse Magnetic-Spiker Sustainer XeCl Laser, Rev. Sci. Instum. 65 (12), (December 1994). The spark method involves the use of spark gaps (ordinary or stabilized by a dielectric surface; see, e.g., U.S. patent application Ser. No. 09/532,276 which is assigned to the same assignee as the present application and is hereby incorporated by reference). The corona-gap method involves the use of pulsed corona-like discharges near a dielectric surface. Spark gap preionizers produce a periodic series of preionized volumes of laser gas along the elongated discharge area of the laser, resulting in some nonuniformity of the discharge. Thus, corona-type preionization is preferred in the present invention.

Areas of focus for design improvement of corona-gap preionizers include the geometry of the dielectric body, and the arrangement of the preionization electrodes. See U.S. Pat. No. 4,718,072 to Marchetti et al. (showing a grounded internal preionization electrode surrounded by a dielectric having a positive potential applied to its outer surface through contact with the positively biased main electrode); European Patent Application (published) EP 0 532 751 A1 (showing an internal preionization electrode surrounded by a dielectric buried in one of the main electrodes); U.S. Pat. No. 4,953,174 to Eldridge et al. (showing the dielectric surrounding an internal preionization electrode abutting with a main discharge electrode); see also R. Marchetti et al., A New Type of Corona-Discharge Preionization Source for Gas Lasers, J. Appl. Phys. 56 (11), (Dec. 1, 1984); U.S. Pat. No. 4,380,079 to Cohn et al.

Reconfiguration of external, electrical circuits is another area where corona-gap pre-ionizer design improvement efforts have been focused. See Taylor et al., citation above; U.S. Pat. No. 5,247,531 to Muller-Horsche (showing an excitation of preionization electrodes affected by the same high voltage source as the main discharge electrodes including a time delay inductance between them), U.S. Pat. No. 5,247,534 to Muller-Horsche (including flow bodies configured to facilitate laser gas flow and formed of material exhibiting secondary x-ray emission characteristics) and U.S. Pat. No. 5,247,535 to Muller-Horsche (disclosing electron emission from a heated cathode, wherein x-rays emitted as the electrons impinge upon a separate anode serve to preionize the laser gas volume).

U.S. Pat. No. 5,337,330 to Larson, hereinafter referred to as the '330 patent, describes the conventional corona-like preionization arrangement generally shown in FIG. 1a. See also U.S. Pat. No. 5,247,391 to Gormley, and U.S. Pat. No. 4,953,174 to Eldridge et al. A discharge chamber having the preionization arrangement of FIG. 1a includes a high voltage main electrode 1 and a grounded main electrode 2. Each preionization unit includes one internal preionization electrode 3a located on one side of main discharge region 5 between the main discharge electrodes 1,2. Each preionization unit includes a dielectric tube 3b of generally cylindrical shape surrounding the internal preionization electrode 3a. A preionization discharge (ultraviolet emission) 4 from the preionization electrodes 3a & 6 and dielectric tubes 3b causes a preionization of the volume of the main gas discharge. A pair of external preionization electrodes 6 of the preionization units comprise metal plates and are each directly connected to the nearby main discharge electrode 1 (e.g., the cathode at high potential). FIG. 1b shows a conventional preionization unit setup wherein only one internal corona-discharge preionization electrode 3a is employed. See U.S. Pat. No. 4,240,044 to Fahlen et al.

In the case of the preionization unit of either of FIG. 1a or 1b, energy stored in the dielectric tubes 3b during a preionization phase, will also be absorbed into the main discharge 5. However, that added energy typically will not increase the laser output due to a high wave impedance of the dielectric tubes 3b. The tubes 3b act much like a charged transmission line in that this wave impedance is typically much higher than the impedance of the main gas discharge. The high wave impedance is caused by a distributed inductivity of each whole dielectric tube 3b (as a transmission line) and a concentrated inductivity at the point of electrical connection of the tubes 3b with the internal corona discharge electrodes 3a.

The residual energy produces high voltage electrical oscillations between the capacitance of the dielectric tubes 3b of the preionization units and the main gas discharge volume. These high voltage oscillations are undesirable because they significantly reduce the ability of the dielectric tubes 3b of the preionization unit to resist direct high voltage breakdown and over-flashing near the open ends of the dielectric tubes 3b. Moreover, these oscillations deteriorate the quality of the main gas discharge 5 and thus hinder the operation of the laser, particularly during operation at a high repetition rate. Furthermore, the oscillations cause additional wear to the main gas discharge electrodes 1,2 and the internal corona discharge electrodes 3a, and also cause contamination and a reduced lifetime of the laser system.

FIG. 1c shows one technique described in the '330 patent for alleviating the high-voltage breakdown and over-flashing problems caused by these oscillations. That technique involves providing a preionization tube 7 with bushings 8 at opposite ends made from an identical material as the tube 7 and integral with the tube 7. The tube 7 with the opposed bushings 8 is described as being machined from a single integral piece of material. U.S. Pat. Nos. 5,818,865 and 5,991,324 describe furtherances of the design described in the '330 patent. The manufacturing of the tubes described in the '330, '865 and '324 patents undesirably involves complexity and cost. Moreover, the high voltage oscillations continue to degrade the quality of the discharge and produce undesirable wear to the main gas discharge electrodes and the internal corona discharge electrodes, and also cause contamination and a reduced lifetime of the laser system, as discussed above.

FIGS. 1d and 1e illustrate another technique which is described at U.S. patent application Ser. No. 09/247,887, hereinafter referred to as the '887 application, which is assigned to the same assignee as the present application, and is hereby incorporated by reference into the present application. In the '887 application, a preionization tube 9 is provided as shown in FIG. 1d with a sealed end 10 and a thick, open end 11 to address the breakdown and over-flashing problems discussed above at each end. In addition, the '887 application discloses to connect the internal preionization electrode as shown in FIG. 1e to ground and/or an electrical circuit 13 including active or passive electrical components via an electrical feedthrough 14 to the outside of the discharge chamber. The preferred electrical circuit disclosed in the '887 application includes a resistor connected to ground and having a resistance comparable to or greater than the wave impedance of the oscillating contour of the preionization unit. The connection to ground via the resistor of the internal preionization electrode serves to dampen the strength of the oscillations.

SUMMARY OF THE INVENTION

It is an object of the invention to design a preionization unit for a laser having a high quality gas discharge by providing an intense, yet uniform, preionization of the gas volume between the main discharge electrodes.

It is also an object of the invention to provide a preionization unit wherein such that over-flashing and high voltage breakdown at the ends of the dielectric tube is prevented.

It is another object of the invention to prevent electrical oscillations from arising out of residual energies stored in the dielectric tube.

The present invention meets all of these objects and addresses the shortcomings of conventional preionization techniques by providing a preionization assembly including a preionization unit for a gas laser which comprises an internal preionization electrode having a dielectric tube around it. The internal electrode is connected to an advantageous electrical circuit. This connection to the electrical circuit reduces the voltage across the dielectric tube, while permitting sufficient preionization of the laser gas. The reduced voltage also allows the dielectric tube to have a uniform bushingless design, and to comprise a standard purity material, without having the flashing-over observed in conventional systems wherein the preionization voltage is not reduced.

Preferably, the internal electrode is connected via a feedthrough to the circuit, which is external to the discharge chamber. Whether or not the circuit is external to the discharge chamber, the circuit preferably includes a resistive element connected in parallel with either a capacitive element or a series combination of a capacitive element and a resistive element. The circuit connection permits the tube to meet the above objects while having a simple manufacturing design comprising an ordinary ceramic with relaxed purity and density specifications relative to conventional tubes, although high purity ceramics may be used. The tube preferably has a substantially cylindrical shape and a uniform diameter, and is preferably open at both ends. The tube further preferably comprises polycrystalline alumina ($Al_2O_3$), and may comprise sapphire. The preionization assembly may comprise one or two or more tubes.

An excimer or molecular fluorine laser system is also provided, including a discharge chamber containing a gas mixture, a first and a second spaced apart main discharge electrodes having a discharge area therebetween within the discharge chamber, the first main discharge electrode being maintained at ground potential, a pulsed power supply unit for applying electrical pulses to the second main discharge electrode for producing discharges between the first and second main discharge electrodes for energizing the gas mixture, at least one preionization unit disposed within the discharge chamber for preionizing the gas mixture within the discharge area prior to application of the electrical pulses to the main discharge electrodes, the preionization unit including first and second preionization electrodes having a dielectric therebetween, an electrical circuit coupled between the first preionization electrode and ground potential, said second preionization electrode being connected to said first main discharge electrode, such that a potential difference applied across the first and second preionization electrodes is substantially less than is applied across the first and second main discharge electrodes by the electrical pulses supplied by the pulsed power supply unit, and a resonator for generating a laser beam, wherein the reduced potential difference applied across the first and second preionization electrodes provides reduced over-flashing and electrical oscillations from residual energies stored in the dielectric.

BRIEF DESCRIPTION OF THE DRAWINGS

FIG. 1a shows a first conventional arrangement of components within a discharge chamber of a high repetition rate pulsed discharge laser having two preionization units including an internal electrode within a dielectric tube and a UV-preionized active discharge volume.

FIG. 1b shows the arrangement of FIG. 1a having instead only one preionization unit.

FIG. 1c shows a second conventional preionization unit wherein the dielectric tube has a pair of bushings at opposed ends.

FIG. 1d shows a side view of a third preionization unit wherein a dielectric tube comprising sapphire has a closed end and an open end with an enlarged outer diameter.

FIG. 4 shows a side view of a preionization unit for use with the discharge chamber of FIG. 3 including a dielectric tube and internal electrode in accord with the present invention.

FIG. 5a shows a preionization electrode having a slit to allow for thermal expansion within the dielectric tube.

FIG. 5b shows a second preionization electrode having an overlap to allow for thermal expansion within the dielectric tube.

FIG. 6 shows a cross-sectional axial view of a preionization assembly including a semi-transparent external mesh electrode in accord with the present invention.

INCORPORATION BY REFERENCE

What follows is a cite list of references each of which is, in addition to those references cited above and below, and including that which is described in the related art description and in the priority section, and the above invention summary, and the abstract below, are hereby incorporated by reference into the detailed description of the preferred embodiment below, as disclosing alternative embodiments of elements or features of the preferred embodiments not otherwise set forth in detail below. A single one or a combination of two or more of these references may be consulted to obtain a variation of the preferred embodiments described in the detailed description below and within the scope of the present invention. Further patent, patent application and non-patent references are cited in the written description and are also incorporated by reference into the detailed description of the preferred embodiment with the same effect as just described with respect to the following references:

U.S. Pat. Nos. 5,247,534, 5,247,535, 5,247,531, 4,380,079, 4,240,044, 4,953,174, 5,247,391, 4,719,637, 5,337,330, 5,090,020, 5,991,324, 5,818,865, 5,081,638, 4,287,483, 4,105,952, 4,498,183, 4,365,337, 5,081,638, 5,875,207, 4,491,949, and 5,042,047;

U.S. patent application Ser. Nos. 09/247,887, 09/532,276, 60/127,237, each of which is assigned to the same assignee as the present application;

EP 0 532 751 A1;

Japanese application no. 3-9582 (Jun. 7, 1989 and Jan. 17, 1991);

German patents no. DE 29521572 U1, DE 2050490, DE 2932781, DE 3313811 A1, DE 3035730 A1;

K. Hohla et al., "ClF and $F_2$: Two New Ultra-violet Laser Systems," Optics and Laser Technology, Vol. 11 number 6, pp. 281–328 (December 1979);

A New Type of Corona-discharge Photoionization Source for Gas Lasers, R. Marchetti and E. Penco, Journal of Applied Physics, 56 (11), pp. 3163–3168 (Dec. 31, 1985);

Pre-ionization of a Long Optical Pulse Magnetic-spike Sustainer XeCl Laser, R. S. Taylor and K. E. Leopold, Review of Scientific Instruments, American Institute of Physics, 65 (12), pp. 3621–3627 (December 1994);

Tatsuo Enami et al., High spectral purity and high durability kHz KrF excimer laser with advanced RF pre-ionization discharge, Proceedings of SPIE, Optical Microlithography XI, Feb. 25–27, 1998, Vol. 3334, pp. 1031–1040;

A. S. Bashkin, et al., High Power 1 μsec ultraviolet radiation source for pumping of gas lasers, Sov. J. of Quantum Electronics, Vol. 6, No. 8, pp. 994–996 (August 1976); and Journal of Technical Physics, Vol. 49, No. 6, pp. 1241–1244.

DETAILED DESCRIPTION OF THE PREFERRED EMBODIMENT

Figure 2:
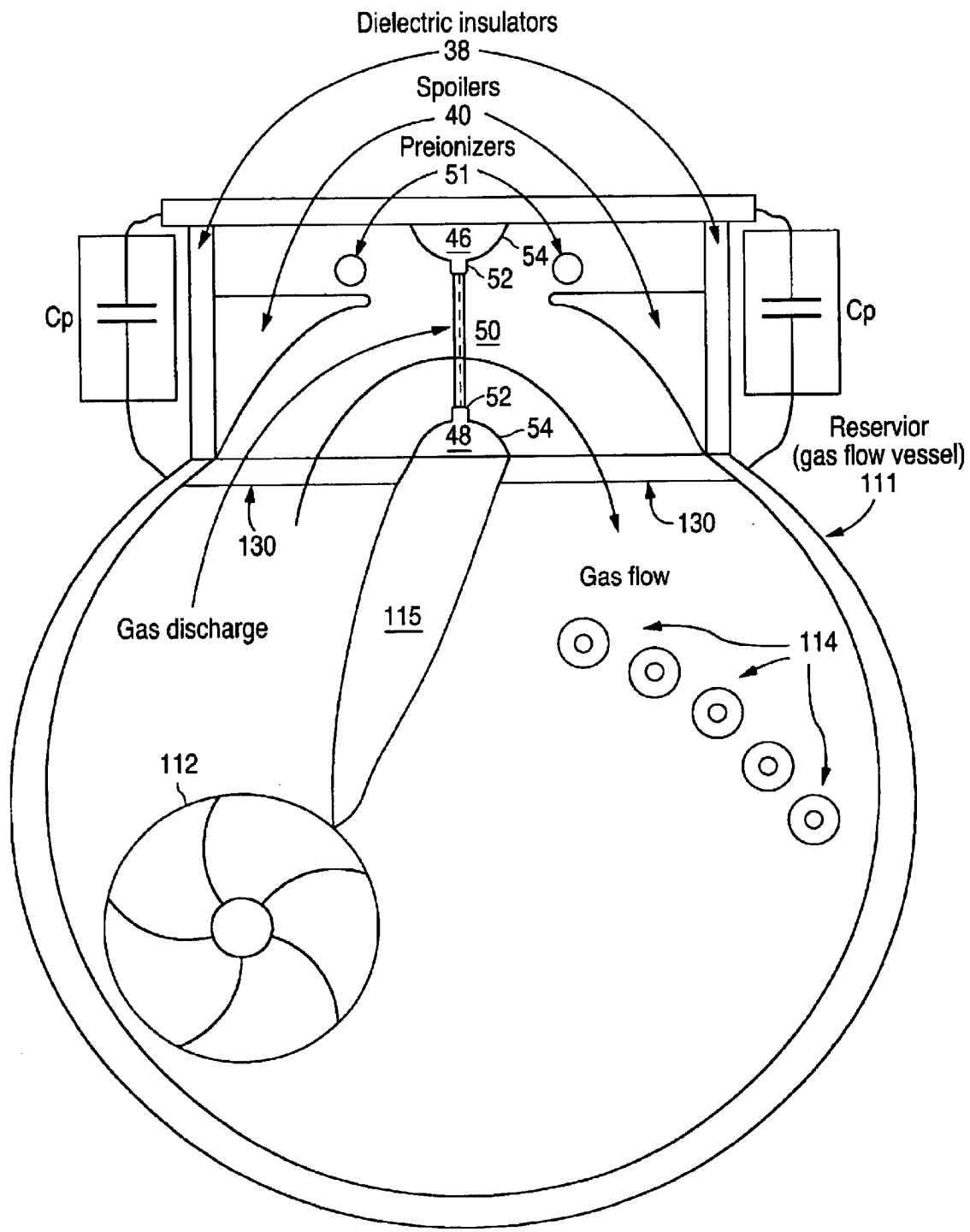
FIG. 2 shows a cross-sectional axial view of a general discharge chamber/gas flow vessel arrangement in accord with the present invention.

FIG. 2 shows a cross-sectional axial view of a general discharge chamber/gas flow vessel arrangement in accord with the preferred embodiment (see U.S. provisional patent application No. 60/128,227, which is assigned to the same assignee as the present invention, and which is hereby incorporated into the present application by reference). The discharge chamber illustrated in cross section at FIG. 2 includes an insulating box or frame 38 (see U.S. patent application Ser. No. 09/453,670, which is assigned to the same assignee as the present application, and Industrial Excimer Lasers: Fundamentals, Technology and Maintenance, Dirk Basting, Ed., $2^{nd}$ edition (1991), each of which is hereby incorporated by reference). The discharge chamber includes a pair of elongated discharge electrodes 46, 48 separated by a discharge area 50. A pair of preionization units 51 are shown positioned near the high voltage main electrode 46 on either side of the discharge area 50.

The dielectric frame 38 is connected to the gas vessel 111 which is connected to the grounded discharge electrode 48. The discharge chamber, as shown in FIG. 2, is attached to the gas vessel 111 at the wall 130 connected to the grounded discharge electrode 48. A set of high voltage capacitors or "peaking" capacitors Cp is preferably positioned as close as possible to the main discharge electrodes 46, 48, and as uniformly as possible over the length of the electrodes 46, 48. One or more sets of sustaining capacitors may be used for stretching the laser pulse received at the electrodes 46, 48, as described in U.S. patent application Ser. Nos. 60/149, 392 and 09/640,595, each of which is assigned to the same assignee as the present application and is hereby incorporated by reference.

One of the main electrodes, in this case electrode 46, is connected to a pulsed high voltage generator and pulse compressor circuit via the peaking capacitors and preferred sustaining capacitors of the '595 application. The high voltage generator preferably includes a solid state switch, and alternatively a thyratron, for providing a fast and powerful charge to the peaking capacitors Cp up to the electrical breakdown voltage of the gas discharge gap 50. The other main electrode 48 is typically connected to ground potential or another substantially fixed reference potential. Fast and powerful discharge of the peaking capacitors Cp, followed by electrical breakdown of the active laser gases in the gas mixture provides the necessary pumping of the gas mixture. The peaking capacitors Cp are preferably disposed outside of the discharge chamber (that is not necessary, but preferred, because it avoids exposure of the peaking capacitors to the aggressive halogen-containing laser gas). The values of the peaking capacitors Cp depend on the discharge and the configuration of the gas mixture and are usually in a range from around 3 nF to around 50 nF, or peaking capacitors preferably from 1 to 2 nF and sustaining capacitors from 5 to 15 nF total capacitance (see the '595 application).

One of the discharge electrodes, the ground electrode 48, is preferably connected directly to the metal body of the discharge chamber. The other or high voltage electrode 46 is connected to the peaking capacitors Cp and is separated from the grounded metal body of the discharge chamber by means of the dielectric (e.g., ceramic) insulator 38.

The gas mixture is characterized as being strongly electronegative and maintained at an elevated pressure (e.g., a few bars). The gas mixture for an excimer laser includes an active rare gas such as krypton, argon or xenon, a halogen containing species such as fluorine or hydrogen chloride, and a buffer gas such as neon and/or helium. A molecular fluorine laser includes molecular fluorine and a buffer gas such as neon and/or helium.

Besides the discharge chamber having an electrical discharge system as discussed above, the overall laser tube further includes a gas vessel 111 having a gas flow system or blower 112 and a heat exchanger 114 as illustrated in FIG. 2. A vane 115 is also shown extending from the blower 112 generally to the electrode 48 of the discharge chamber. The blower 112 forces the gas to flow generally as indicated by the arrows in FIG. 2. The gas mixture is naturally heated as it is excited by the electrical discharge in the discharge area 50. The heat exchanger 114 cools the heated gas after it exits the discharge chamber. The portion of the gas mixture that participates in a laser pulse is replaced by fresh gas before the next laser pulse occurs (see U.S. patent application Ser. No. 60/173,993, which is assigned to the same assignee as the present application and is hereby incorporated by reference).

Although not shown, but described in more detail below, a gas supply unit also preferably supplies fresh gas to the system from outside gas containers to replenish each of the components of the gas mixture. In accord with the preferred embodiment, a pair of spoilers 40 are also shown in FIG. 2 for shaping the gas flow through the discharge area, and each of the electrodes 46 and 48 of FIG. 2 has a raised central portion 52. Further details of the spoilers and electrode shapes and other features of the preferred discharge chamber are provided in U.S. patent application Ser. No. 09/453,670, which is assigned to the same assignee as the present application and is hereby incorporated by reference.

Figure 1E:
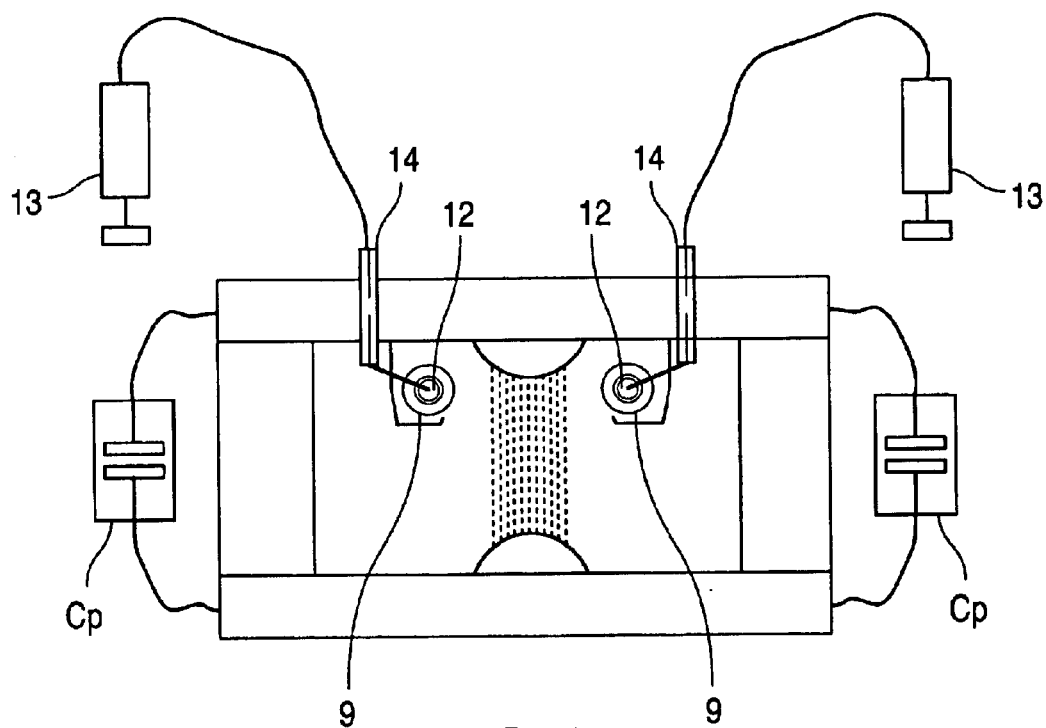
FIG. 1e shows a cross-sectional axial view of a discharge chamber of a gas discharge laser including a fourth preionization assembly wherein the internal electrode of the preionization unit is connected via a feedthrough to external circuitry located outside of the discharge chamber.
Figure 3:
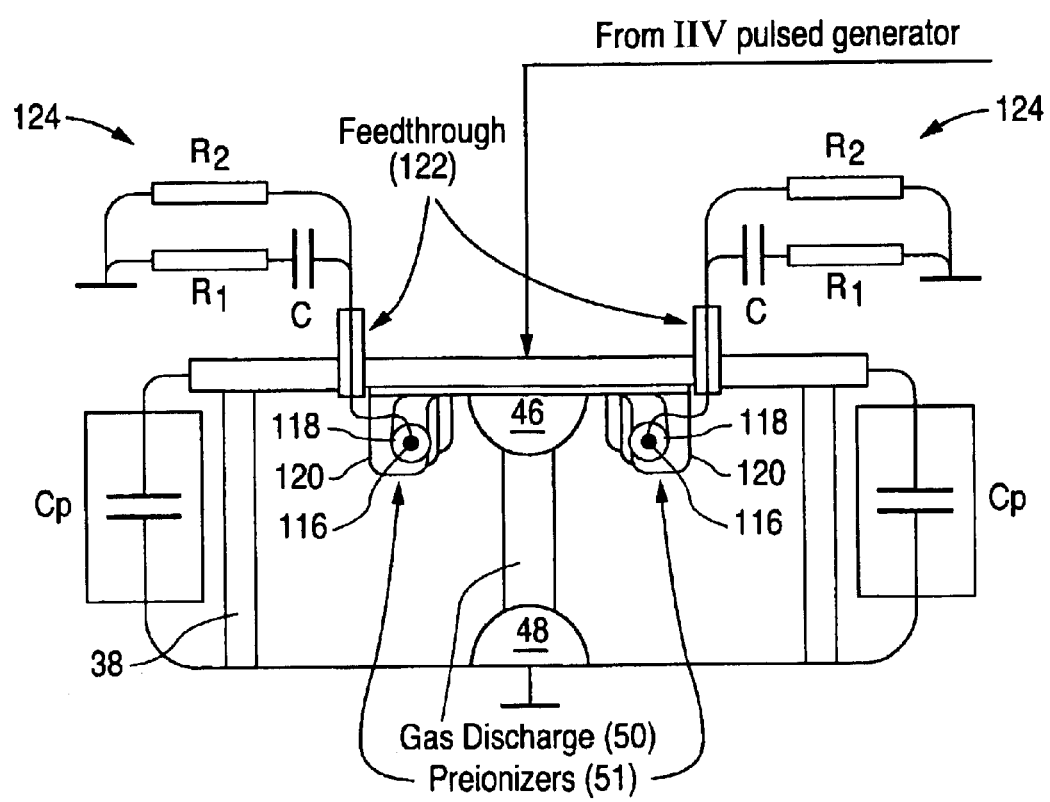
FIG. 3 shows a detailed view of the discharge chamber of FIG. 2 in accord with the present invention.

FIG. 3 shows a detailed view of the discharge chamber of FIG. 2 in accord with the preferred embodiment. FIG. 3 does not show the spoilers 40 and raised central portions 52 of the main electrodes 46 and 48 only for simplicity, while those features are preferably included in the embodiment shown at FIG. 3. FIG. 3 shows a discharge chamber including a corona preionization assembly including two corona units 51. Each corona unit 51 shown includes an internal electrode 116 surrounded by a dielectric tube 118. An external electrode 120 is shown connected to the main electrode 46. A potential difference between the internal electrode 116 and external electrode 118 of each preionization unit 51 occurs when a pulse is received from the HV pulsed generator. The preferred external electrode specifications, as well as preferred holders or means for supporting the preionization units 51 within the discharge chamber, are set forth in U.S. patent application Ser. No. 09/247,887, which is assigned to the same assignee as the present application, and which is hereby incorporated by reference into the present application. The UV radiation emitted by the preionization units 51 as a result of this potential difference preionizes gaseous components within the discharge area 50.

The internal electrodes 116 of the preionization units 51 have in the past been connected directly to ground. This conventional approach, however, allows undamped electrical oscillations to arise out of residual energy stored in the dielectric tube 118, as described above in the background. This conventional approach also allows electrical overflashing from the ends of the dielectric tube 118, unless the tube 118 is formed to prevent this flashing-over (see U.S. patent application Ser. No. 09/247,887, discussed above). This over-flashing, or direct corona discharging between the internal electrode 116 and the external surface of the tube 118 or external electrode 120, is undesirable because such discharging can terminate the preionizing corona discharge along the dielectric tube 118, and trigger severe arcing at the tube ends resulting in possible damage or destruction of the dielectric tube 118 due to increased energy dissipation. The flashing over develops in parallel with the preionizing corona discharge. Flashing-over at an end of a preionizer tube over some locally contaminated area (which are typically present) leads to enhanced dissipation of energy in this area. When the discharge repetition rate is high (e.g., 1–4 kHz, or more), this leads to power dissipation at the ends of the preionization tube, and finally to mechanical destruction of the dielectric tube.

For these reasons, each internal electrode 116 of the preionization units 110 of the preferred embodiment is connected to advantageous circuitry 124. The external electrodes 120 may alternatively be connected to the electrode 46 through advantageous circuitry corresponding to the circuitry 124 of the preferred embodiment. Either preionization electrode 116 or 120 may be connected to advantageous circuitry according to the preferred embodiments and within the scope of the invention, wherein the electrode connected to the advantageous circuitry could be the hot or cold electrode. In any of the four possible situations, i.e., external or internal preionization electrode 116 or 120 connected to cold or hot main discharge electrode 46 or 48 via the advantageous circuitry, the circuitry 124 preferably includes capacitive and resistive elements serving to reduce the potential difference applied across the preionization tube 118 when pulses are applied from an electrical pulse generating circuit.

Generally with respect to the inclusion of the circuitry 124 in the preferred embodiment, the electrical current or voltage or the duration of electrical pulses applied to the preionization units is reduced advantageously. As a result, the power dissipation at these end areas of the dielectric tube is reduced, and not catastophic, even when the tube has a bushingless design, and/or comprises materials of ordinary purity. Flashing over the end areas is significantly reduced or prevented altogether.

The intensity of the preionization also reduces along with the current, voltage and/or pulse duration reduction and flashing over prevention or reduction. However, our experiments showed that this reduced preionization intensity is nonetheless sufficient for normal operation of the laser. That is, such parameters as efficiency, energy stability and gas lifetime do not change significantly as a result.

The achievement of the reduction of preionization power in accord with the preferred embodiment can be realized in any of several ways. For example, a special external generator of high voltage pulses may be used. Preferably, and as observed in the exemplary preferred embodiment shown in FIG. 3 and described below, circuit elements such as a capacitor and/or one or more resistive elements are connected between the internal electrode and ground to reduce the energy due to the potential difference applied to the dielectric tube upon receipt of pulses from the HV pulsed generator.

Referring to FIG. 3, each internal electrode 116 of the preionization units 51 is preferably connected via a feedthrough 122 to electrical circuitry 124 located outside of the discharge chamber (see '887 application for further details of the feedthrough design). The feedthroughs 122 sealably penetrate the discharge chamber from the outside, and advantageously allow the electrical circuitry 124 (i.e., external to the discharge chamber) to be connected to the internal electrodes 116 of the preionization units 110. Alternatively, the circuitry 124 may be inside of the discharge chamber, such as in a protective housing free from exposure to the laser gas mixture.

The electrical circuitry 124 (which may or may not be connected external to the discharge chamber) as shown in FIG. 3 comprises a capacitor C connected in series with a first resistor $R_1$ which is connected to ground. The capacitor C/first resistor $R_1$ series combination is connected in parallel with a second resistor $R_2$.

The capacitance value of the capacitor C is preferably selected to be around or below the capacitance value of the tube 118, such as between 10% and 125% of the capacitance value of the tube 118. The tube typically has a capcitance value around 0.2 nF to 0.7 nF, and so the preferred capacitance value of the capacitor is between around 0.1 nF and the capcitance value of the tube, e.g., 0.7 nF, and is preferably around 0.3 nF. The resistance value of the resistor $R_1$ is preferably between 10 and 1000 ohms, and may particularly be between 30 and 50 ohms. The resistor $R_2$ of the electrical circuitry 124 has a resistance value of preferably between 100 k$\Omega$ and 10 M$\Omega$. $R_2$ functions to discharge the capacitor C.

Advantageously, the high voltage applied from the pulsed generator circuit connected to the high voltage main electrode 46 is fully applied to the gas volume within the discharge area 50, while a lower voltage produces the corona discharge at the preionization units 51. This lower preionization voltage, determined in part by the relative capacitances of the tube 118 and the capacitor C, is advantageous because it produces a sufficient corona discharge, while furthering the above stated objects of the invention, e.g., by reducing overflashing at the ends of the dielectric tube 118. The electrical circuitry 124 may include more complex passive and/or active electrical components. For example, alternative external circuitry 124 connected to the internal electrodes 16 may provide electrical pulses of desired shape and periodicity (see, e.g., U.S. Pat. No. 6,005,880, which is hereby incorporated by reference, as disclosing to use a saturable inductor to introduce a adjustable delay).

The feedthroughs 122 provide the connection of the internal electrodes 116 to the above or any of a wide variety of other useful external electrical devices 124. The advantageous external circuitry 124 permits the preionization assembly to achieve the objects of the invention as set forth above, while the tubes 118 of the preionization units 110 may have a less complicated shape and composition than those of conventional arrangements.

FIG. 4 shows a side view of a preionization unit 51 for use with the discharge chamber of FIG. 3 including a dielectric tube 118 and internal electrode 116 in accord with the preferred embodiment. The internal electrode 116 is preferably cylindrical and is positioned within the hollow interior of the tube 118, which itself preferably has the shape of a cylindrical shell. The advantageous features of the preferred embodiment discussed above with respect to FIG. 3 permit the tube 118 to have an easily manufacturable and inexpensive shape and composition.

The tube 118 shown in FIG. 4 is preferably a one-piece, one-material construction. The tube 118 is preferably a cylindrical shell having a smooth and uniform outer diameter. Preferably, the outer diameter is the same along the entire length of the tube. Such homogeneously formed ceramic tubes 118 are readily available from suppliers at low cost.

The dielectric tube 118 comprises a material suitable for use inside a laser gas mixture which includes an aggressive halogen (e.g., fluorine or hydrogen chloride), such as would be encountered in a KrF, ArF, XeF, XeCl, KrCl, KrF or $F_2$ laser. The material of the tube 118 is also capable of sustaining a capacitively coupled gas discharge. That is, the material has sufficient dielectric strength to support an intense surface electrical gas discharge. For this reason, the preferred dielectric tube 118 comprises a ceramic such as $Al_2O_3$. The crystalline form (also known as sapphire), as well as the polycrystalline form of $Al_2O_3$, or alumina, may be used (see U.S. Pat. No. 4,891,818, which is hereby incorporated by reference for a discussion of materials that may alternatively be used). For the XeCl laser, quartz (fused silica) may be used.

The advantageous features of the present invention as discussed above with respect to the external circuitry 124 of FIG. 3 permit the tube to comprise the simple polycrystalline form of $Al_2O_3$ without any particularly high standards of purity or density while still keeping with the objects of the invention. The preferred circuitry 124 reduces the voltage of the electrical discharge experienced by the tube 118, thus substantially increasing the lifetime of the tube 118 by preventing the high voltage oscillations, as well as the overflashing and dielectric breakdown from the ends of the tube 118.

The dielectric tube 118 is preferably open at both ends, but may have a closed or sealed end and an open end, as described in the '887 application. The closure would serve to electrically insulate the internal preionization electrode 116 at the closed end and prevent direct flashing-over at that end. The preferred tube 118 of the present invention, comprising simple ceramic and having a simple shape and two open ends is advantageous, however, because it is more easily manufacturable and readily available. The preferred tube 118 having two open ends has a somewhat greater length than the internal electrode 116, as shown in FIG. 4 and subject to the dimensional constraints of the discharge chamber, to further reduce the probability of occurrence of over-flashing and breakdown from the ends of the tube 118. The dielectric tube 118 is preferably 6 to 60 mm longer at each end than either or each of the internal and external preionization electrodes 116, 118, respectively.

Each of the surface corona intensity and flashing-over probability also depends on the specific capacity (or capacitance) of the dielectric tube 118. In turn, the specific capacity is approximately inversely proportional to the logarithm of the ratio of external-to-internal dielectric tube diameters. Thus, an increase in the external-to-internal dielectric tube diameter ratio generally causes a reduction of both the surface corona intensity and the flashing-over probability. That is, a larger external diameter of the dielectric tube 118 at the open ends would provide a smaller capacitance at the open ends of the tube 118, and reduced flashing over probability. Therefore, the external-to-internal tube diameter ratio is selected in combination with the capacitance and resistance values of the external circuitry, among other factors, to provide the optimum corona intensity, considering the desire to minimize the flashing-over probability. The optimum external diameter and length of the tube 118 depends on several factors including the overall geometric design of the laser, values of the applied voltages, timing of voltage pulses, and the laser gas mixture. The external diameter of the tube 118 is also constrained by the proximity of the main electrode, and the probability of cascade electrical breakdown from the tube 118 to ground. Some exemplary data include the following:

internal diameter of dielectric tube 118: 1 to 6 mm;
external diameter of tube 118: 6 to 10 mm; and
total length of tube 118: 0.5 to 1.0 m.

The internal electrode 116 of the preionizer preferably substantially fills the entire internal cross-section of the dielectric tube 118 during operation to facilitate strong capacitive coupling between the preionization discharge and the internal electrode 116. This is because any space between the internal electrode 116 and the dielectric tube 118 should be kept to a minimum. Only a small spacing should be provided to allow for any enhanced thermal expansion rate that the internal electrode 116 may exhibit over the dielectric tube 118 during operation.

The internal electrode 116 preferably comprises a metal tube or a solid metal rod. As shown in FIGS. 5a and 5b, a thin walled flexible metal tube having a small longitudinal "slit" 130 (see FIG. 5a) or "overlap" 132 (see FIG. 5b) along its length may also be used. These slit 130 and overlap 132 designs each provide the above-described small spacing between the internal electrode 116 and dielectric tube 118 wherein a thermally induced mechanical stress to the dielectric tube 118 is minimized. The slit 130 or overlap 132 would allow for thermal expansion of the metal internal electrode 116. The internal electrode 116 may alternatively comprise a conductive liquid.

FIG. 6 shows a cross-sectional axial view of a preionization assembly including a semi-transparent external mesh electrode 126 in accord with the preferred embodiment and in substantial accord with the '887 application incorporated by reference above (see the '887 application for more details). The discharge chamber is again shown in simplified form, where the features shown at FIG. 2 such as the spoilers 40 and raised electrode portions 52 are preferably actually included. The surface discharge over the tube 118 basically causes a distortion of the electrical field in the area of the main discharge 50. That distortion is reduced by using a semitransparent electrode 126 which better shields the preionization field from the main discharge area 50 and grounded main electrode 48. The reduction in distortion results in more stable laser operation, especially at high repetition rates.

The semi-transparent mesh electrode 126 preferably at least partially comprises a wire mesh or a perforated foil. The semi-transparent electrode 126 partially covers the preionization unit 51, shielding the main discharge area 50 from fields of the preionization unit 51 and preventing electric field distortion there. The arrangement shown in FIG. 6 also includes support elements 128, 129 and 130. Support element 128 supports the mesh electrode 126. Support element 129 supports the external electrode 120 and preferably comprises a metal or other conductor. Support element 130 supports the dielectric tube 118 and preferably comprises a ceramic or other insulator with appropriate dielectric properties.

The objects of the invention set forth above are thus met. Electrical oscillations arising out of residual energies stored in the dielectric tube 118 are prevented by connecting the internal electrodes 116 to external circuitry 124 via the feedthroughs 122. Over-flashing and dielectric breakdown at the tube ends are also prevented, and a simpler tube design may even be used. In addition to these advantages, a sufficiently intense, uniform preionization provides a high quality main discharge. The semi-transparent mesh electrode 126 also facilitates the above objects by reducing distortion of the electrical field in the area of the main discharge 50.

Figure 7:
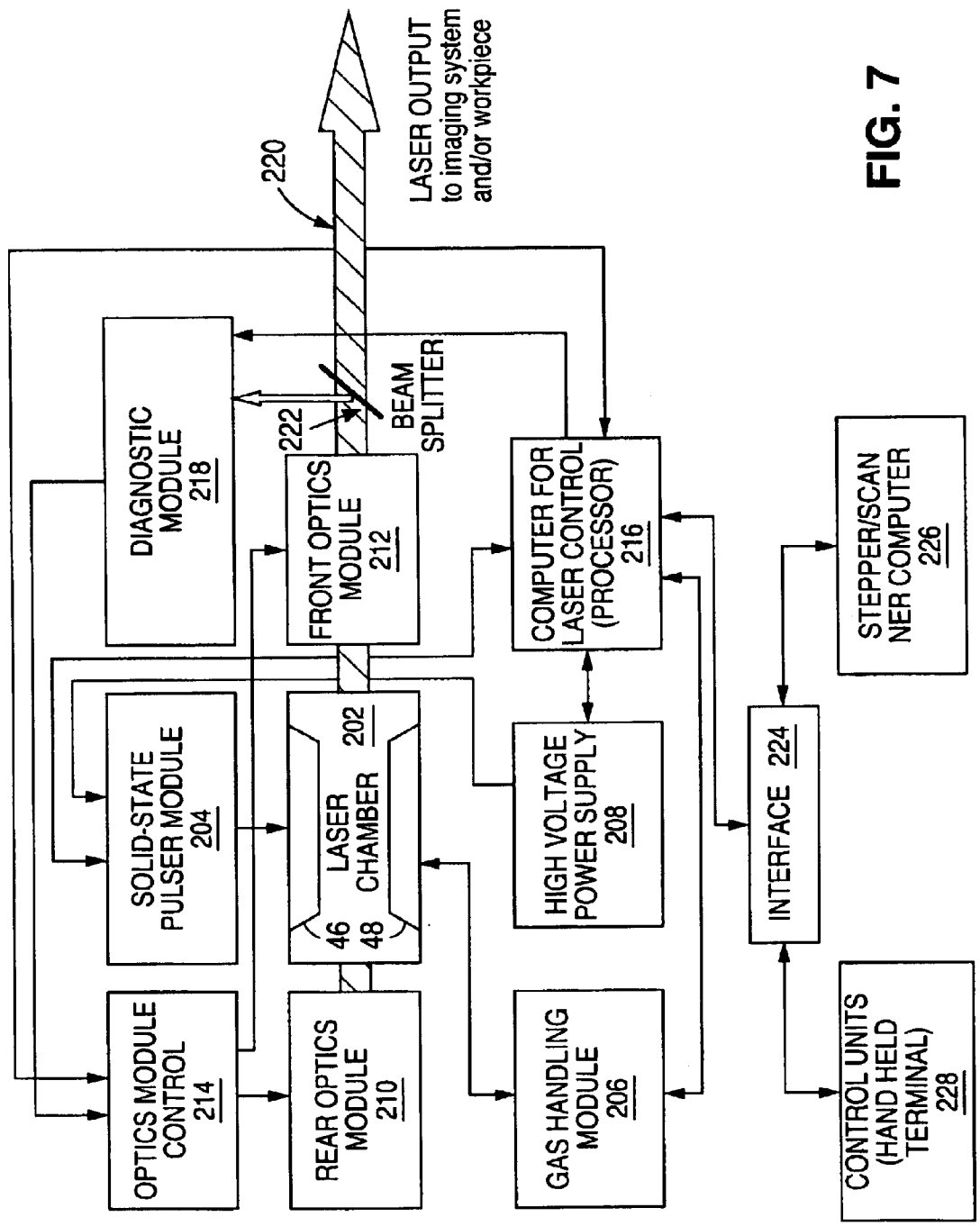
FIG. 7 schematically shows an excimer or molecular fluorine laser system according to a preferred embodiment.

The details of the discharge chamber, and particularly relating to the preionization electrodes 51, of the preferred embodiment may be advantageously used to achieve an excimer or molecular fluorine laser for such industrial applications as microlithography, TFT annealing and micromachining. Referring to FIG. 7, a gas discharge laser system, preferably a DUV or VUV laser system, such as an excimer, e.g., ArF or KrF, or molecular fluorine ($F_2$) laser system for deep ultraviolet (DUV) or vacuum ultraviolet (VUV) lithography, is schematically shown. Alternative configurations for laser systems for use in such other industrial applications as TFT annealing and/or micromachining, e.g., are understood by one skilled in the art as being similar to and/or modified from the system shown in FIG. 7 to meet the requirements of that application. For this purpose, alternative DUV or VUV laser system and component configurations are described at U.S. patent application Ser. Nos. 09/317,695, 09/317,526, 09/130,277, 09/244,554, 09/452, 353, 09/317,527, 09/343,333, 60/122,145, 60/140,531, 60/162,735, 60/166,952, 60/171,172, 60/141,678, 60/173, 993, 60/166,967, 60/147,219, 60/170,342, 60/162,735, 60/178,445, 60/166,277, 60/167,835, 60/171,919, 60/202, 564, 60/204,095, 60/172,674, 09/574,921 and 60/181,156, and U.S. Pat. Nos. 6,005,880, 6,061,382, 6,020,723, 5,946, 337, 6,014,206, 5,559,816, 4,611,270, 5,761,236, each of which is assigned to the same assignee as the present application and is hereby incorporated by reference.

The system shown in FIG. 7 generally includes a laser chamber 202 having a pair of main discharge electrodes 46, 48, e.g., as described above with respect to FIG. 2, connected with a solid-state pulser module 204, and a gas handling module 206. The solid-state pulser module 204 is powered by a high voltage power supply 208. The laser chamber 202 is surrounded by optics module 210 and optics module 212, forming a resonator. The optics modules 210 and 212 are controlled by an optics control module 214, or may be alternatively directly controlled by a computer 216.

The computer 216 for laser control receives various inputs and controls various operating parameters of the system. A diagnostic module 218 receives and measures one or more parameters of a split off portion of the main beam 220 via optics for deflecting a small portion of the beam toward the module 218, such as preferably a beam splitter module 222, as shown. The beam 220 is preferably the laser output to an imaging system (not shown) and ultimately to a workpiece (also not shown), and may be output directly to an application process. The laser control computer 216 communicates through an interface 224 with a stepper/scanner computer 226 and other control units 228.

Laser Chamber

The laser chamber 202 contains a laser gas mixture and includes one or more preionization electrodes (not shown here, but described above with respect to FIGS. 2–6) in addition to the pair of main discharge electrodes 46, 48. Preferred main electrodes 46 and 48 are described at U.S. patent application Ser. Nos. 09/453,670, 60/184,705 and 60/128,227, each of which is assigned to the same assignee as the present application and is hereby incorporated by reference. Other electrode configurations are set forth at U.S. Pat. Nos. 5,729,565 and 4,860,300, each of which is assigned to the same assignee, and alternative embodiments are set forth at U.S. Pat. Nos. 4,691,322, 5,535,233 and 5,557,629, all of which are hereby incorporated by reference. Preferred preionization units are described above with respect to FIGS. 2–6, and details and alternative configurations are additionally set forth at U.S. patent application Ser. Nos. 60/162,845, 60/160,182, 60/127,237, 09/535,276 and 09/247,887, each of which is assigned to the same assignee as the present application, and alternative embodiments are set forth at U.S. Pat. Nos. 5,337,330, 5,818,865 and 5,991,324, all of the above patents and patent applications being hereby incorporated by reference.

Power Supply Circuit and Pulser Module

The solid-state pulser module 204 and high voltage power supply 208 supply electrical energy in compressed electrical pulses to the preionization and main electrodes 46, 48 within the laser chamber 202 to energize the gas mixture. Components of the preferred pulser module and high voltage power supply may be described at U.S. patent application Ser. Nos. 60/149,392, 60/198,058, 60/204,095, 09/432,348 and 09/390,146, and 60/204,095, and U.S. Pat. Nos. 6,005,880 and 6,020,723, each of which is assigned to the same assignee as the present application and which is hereby incorporated by reference into the present application. Other alternative pulser modules are described at U.S. Pat. Nos. 5,982,800, 5,982,795, 5,940,421, 5,914,974, 5,949,806, 5,936,988, 6,028,872 and 5,729,562, each of which is hereby incorporated by reference. A conventional pulser module may generate electrical pulses in excess of one Joule of electrical power (see the '988 patent, mentioned above).

Laser Resonator

The laser resonator which surrounds the laser chamber 202 containing the laser gas mixture includes optics module 210 including line-narrowing optics for a line narrowed excimer or molecular fluorine laser, which may be replaced by a high reflectivity mirror or the like in a laser system wherein either line-narrowing is not desired, or if line narrowing is performed at the front optics module 212, or a spectral filter external to the resonator is used, or if the line-narrowing optics are disposed in front of the HR mirror, for narrowing the linewidth of the output beam.

The laser chamber 202 is sealed by windows transparent to the wavelengths of the emitted laser radiation 220. The windows may be Brewster windows or may be aligned at another angle, e.g., 5°, to the optical path of the resonating beam. One of the windows may also serve to output couple the beam.

Extra-resonator Features

After a portion of the output beam 220 passes the outcoupler of the optics module 212, that output portion impinges upon beam splitter module 222 which includes optics for deflecting a portion of the beam to the diagnostic module 218, or otherwise allowing a small portion of the outcoupled beam to reach the diagnostic module 218, while a main beam portion 220 is allowed to continue as the output beam 220 of the laser system. Preferred optics include a beamsplitter or otherwise partially reflecting surface optic. The optics may also include a mirror or beam splitter as a second reflecting optic. More than one beam splitter and/or HR mirror(s), and/or dichroic mirror(s) may be used to direct portions of the beam to components of the diagnostic module 218. A holographic beam sampler, transmission grating, partially transmissive reflection diffraction grating, grism, prism or other refractive, dispersive and/or transmissive optic or optics may also be used to separate a small beam portion from the main beam 220 for detection at the diagnostic module 218, while allowing most of the main beam 220 to reach an application process directly or via an imaging system or otherwise.

The output beam 220 may be transmitted at the beam splitter module 222 while a reflected beam portion is directed at the diagnostic module 218, or the main beam 220 may be reflected, while a small portion is transmitted to the diagnostic module 218. The portion of the outcoupled beam which continues past the beam splitter module 222 is the output beam 220 of the laser, which propagates toward an industrial or experimental application such as an imaging system and workpiece for photolithographic applications. Variations of beam splitter modules 222 particularly for a molecular fluorine laser system are set forth at U.S. patent application Ser. Nos. 09/598,552 and 60/140,530, which are each assigned to the same assignee as the present application and are hereby incorporated by reference.

Beam Path Enclosure

Also particularly for the molecular fluorine laser system, and for the ArF laser system, an enclosure (not shown) may seal the beam path of the beam 220 such as to keep the beam path free of photoabsorbing species. Smaller enclosures may seal the beam path between the chamber 202 and the optics modules 210 and 212 and between the beam splitter module 222, which itself may be within the same or a separate enclosure, and the diagnostic module 218. The preferred enclosure is described in detail in U.S. patent application Ser. Nos. 09/343,333, 09/598,552, 09/594,892, 09/131,580 and 60/140,530, each of which is assigned to the same assignee and is hereby incorporated by reference, and U.S. Pat. Nos. 5,559,584, 5,221,823, 5,763,855, 5,811,753 and 4,616,908, all of which are hereby incorporated by reference.

Diagnostic Module

The diagnostic module 218 preferably includes at least one energy detector. This detector measures the total energy of the beam portion that corresponds directly to the energy of the output beam 220 (see U.S. Pat. No. 4,611,270 and U.S. patent application Ser. No. 09/379,034, each of which is assigned to the same assignee and is hereby incorporated by reference. An optical configuration such as an optical attenuator, e.g., a plate or a coating, or other optics may be formed on or near the detector or beam splitter module 222 to control the intensity, spectral distribution and/or other parameters of the radiation impinging upon the detector (see U.S. patent application Ser. Nos. 09/172,805, 60/172,749, 60/166,952 and 60/178,620, each of which is assigned to the same assignee as the present application and is hereby incorporated by reference).

One other component of the diagnostic module 218 is preferably a wavelength and/or bandwidth detection component such as a monitor etalon or grating spectrometer (see U.S. patent application Ser. Nos. 09/416,344, 60/186,003, 60/158,808, 60/186,096, 60/186,096 and 60/186,096 and 60/202,564, each of which is assigned to the same assignee as the present application, and U.S. Pat. Nos. 4,905,243, 5,978,391, 5,450,207, 4,926,428, 5,748,346, 5,025,445, and 5,978,394, all of the above wavelength and/or bandwidth detection and monitoring components being hereby incorporated by reference. The spectrometer may be within a temperature and pressure controlled housing such as is described in the Ser. No. 60/158,808 application.

Other components of the diagnostic module may include a pulse shape detector or ASE detector, such as are described at U.S. patent application Ser. Nos. 09/484,818 and 09/418,052, respectively, each of which is assigned to the same assignee as the present application and is hereby incorporated by reference, such as for gas control and/or output beam energy stabilization, or to monitor the amount of amplified spontaneous emission (ASE) within the beam to ensure that the ASE remains below a predetermined level, as set forth in more detail below. There may be a beam alignment monitor, e.g., such as is described at U.S. Pat. No. 6,014,206 which is assigned to the same assignee and is hereby incorporated by reference.

Control Processor

The processor or control computer 216 receives and processes values of some of the pulse shape, energy, ASE, energy stability, energy overshoot for burst mode operation, wavelength, spectral purity and/or bandwidth, among other input or output parameters of the laser system and output beam. The processor 216 also controls the line narrowing module to tune the wavelength and/or bandwidth or spectral purity, and controls the power supply and pulser module 204 and 208 to control preferably the moving average pulse power or energy, such that the energy dose at points on the workpiece is stabilized around a desired value. In addition, the computer 216 controls the gas handling module 206 which includes gas supply valves connected to various gas sources. Further details of the control processor 216 such as for performing burst overshoot control and controlling the gas supply unit by monitoring total input energy to the discharge, among other parameters, for determining the timing and amounts of gas replenishment actions, are described at U.S. patent application Ser. No. 60/159,525, which is assigned to the same assignee as the present application and is hereby incorporated by reference.

Gas Mixture

The laser gas mixture is initially filled into the laser chamber 202 during new fills. The gas composition for a very stable excimer or molecular fluorine laser in accord with the preferred embodiment uses helium or neon or a mixture of helium and neon as buffer gas(es), depending on the particular laser being used. Preferred gas compositions are described at U.S. Pat. Nos. 4,393,405 and 4,977,573 and U.S. patent application Ser. Nos. 09/317,526, 09/513,025, 60/124,785, 09/418,052, 60/159,525 and 60/160,126, each of which is assigned to the same assignee and is hereby incorporated by reference into the present application. The concentration of the fluorine in the gas mixture may range from 0.003% to 1.00%, and is preferably around 0.1%. An additional gas additive, such as a rare gas, such as xenon, may be added for increased energy stability and/or as an attenuator as described in the Ser. No. 09/513,025 application incorporated by reference above. Specifically, for the $F_2$-laser, an addition of xenon and/or argon may be used. The concentration of xenon or argon in the mixture may range from 0.0001% to 0.1%. For an ArF-laser, an addition of xenon or krypton may be used also having a concentration between 0.0001% to 0.1%. For the KrF laser, an addition of xenon or argon may be used also having a concentration between 0.0001% to 0.1%.

Gas Replenishment, General

Halogen and rare gas injections, total pressure adjustments and gas replacement procedures are performed using the gas handling module 206 preferably including a vacuum pump, a valve network and one or more gas compartments. The gas handling module 206 receives gas via gas lines connected to gas containers, tanks, canisters and/or bottles. Some preferred and alternative gas handling and/or replenishment procedures are described at U.S. Pat. Nos. 4,977,573 and 5,396,514 and U.S. patent application Nos. 60/124,785, 09/418,052, 09/379,034, 60/159,525, 60/171,717, and 60/159,525, each of which is assigned to the same assignee as the present application, and U.S. Pat. Nos. 5,978,406, 6,014,398 and 6,028,880, all of which are hereby incorporated by reference. A xenon gas supply may be included either internal or external to the laser system according to the '025 application, mentioned above.

Line-narrowing

A general description of the line-narrowing features of the preferred embodiment is provided here, followed by a listing of patent and patent applications being incorporated by reference as describing variations and features that may used with the preferred embodiments described above for providing an output beam with a high spectral purity or bandwidth (e.g., below 0.6 pm). Exemplary line-narrowing optics contained in the optics module 210 include a beam expander, an optional etalon and a diffraction grating, which produces a relatively high degree of dispersion, for a narrow band laser such as is used with a refractive or catadioptric optical lithography imaging system. As referred to above, the front optics module 212 may include line-narrowing optics (e.g., etalon, birefringent plate, grating, grism) as well (see the Ser. Nos. 60/166,277, 60/173,993 and 60/166,967 applications, each being assigned to the same assignee and hereby incorporated by reference).

For a semi-narrow band laser such as is used with an all-reflective imaging system, the grating may be replaced with a highly reflective mirror, and a lower degree of dispersion may be produced by a dispersive prism. A semi-narrow band laser would typically have an output beam linewidth in excess of 1 pm and may be as high as 100 pm in some laser systems, depending on the characteristic broadband bandwidth of the laser.

The beam expander of the above exemplary line-narrowing optics of the optics module 210 preferably includes one or more prisms. The beam expander may include other beam expanding optics such as a lens assembly or a converging/diverging lens pair. The grating or a highly reflective mirror is preferably rotatable and in Littrow configuration so that the wavelengths reflected into the acceptance angle of the resonator can be selected or tuned. Alternatively, the grating, or other optic or optics, or the entire line-narrowing module may be pressure tuned, such as is set forth in the Ser. Nos. 60/178,445 and 09/317,527 applications, each of which is assigned to the same assignee and is hereby incorporated by reference. The grating may be used both for dispersing the beam for achieving narrow bandwidths and also preferably for retroreflecting the beam back toward the laser tube. Alternatively, a highly reflective mirror may be positioned before or after the grating which receives a reflection from the grating and reflects the beam back toward the grating, such as in a Littman configuration, or the grating may be a transmission grating. One or more dispersive prisms may also be used, and more than one etalon may be used.

Depending on the type and extent of line-narrowing and/or selection and tuning that is desired, and the particular laser that the line-narrowing optics are to be installed into, there are many alternative optical configurations that may be used. For this purpose, those shown in U.S. Pat. Nos.

4,399,540, 4,905,243, 5,226,050, 5,559,816, 5,659,419, 5,663,973, 5,761,236, and 5,946,337, and U.S. patent application Ser. Nos. 09/317,695, 09/130,277, 09/244,554, 09/317,527, 09/073,070, 60/124,241, 60/140,532, 60/147,219 and 60/140,531, 60/147,219, 60/170,342, 60/172,749, 60/178,620, 60/173,993, 60/166,277, 60/166,967, 60/167,835, 60/170,919, 60/186,096, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, 5,970,082, 5,978,409, 5,999,318, 5,150,370 and 4,829,536, and German patent DE 298 22 090.3, are each hereby incorporated by reference into the present application.

Optics module 212 preferably includes means for outcoupling the beam 220, such as a partially reflective resonator reflector. The beam 220 may be otherwise outcoupled such as by an intra-resonator beam splitter or partially reflecting surface of another optical element, and the optics module 212 would in this case include a highly reflective mirror. The optics control module 214 preferably controls the optics modules 210 and 212 such as by receiving and interpreting signals from the processor 216, and initiating realignment or reconfiguration procedures (see the '241, '695, '277, '554, and '527 applications mentioned above).

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

We claim:

1. An excimer or molecular fluorine laser system, comprising:
   a discharge chamber containing a gas mixture;
   a first and a second spaced apart main discharge electrodes having a discharge area therebetween within the discharge chamber, the first main discharge electrode being maintained at ground potential;
   a pulsed power supply unit for applying electrical pulses to the second main discharge electrode for producing discharges between the first and second main discharge electrodes for energizing the gas mixture;
   a resonator for generating a laser beam;
   at least one preionization unit disposed within the discharge chamber for preionizing the gas mixture within the discharge area prior to application of the electrical pulses to the main discharge electrodes, the preionization unit including first and second preionization electrodes having a bushingless dialectric tube surrounding the first preionization electrode, said second preionization electrode being electrically connected to said second main discharge electrode; and
   an electrical circuit coupled between the first preionization electrode and ground potential, such that a potential difference applied across the first and second preionization electrodes is substantially less than is applied across the first and second main discharge electrodes by the electrical pulses supplied by the pulsed power supply unit, such that both over-flashing and electrical oscillations from residual energies stored in the bushingless dielectric tube are reduced.

2. The system of claim 1, wherein the electrical circuit includes a capacitor.

3. The system of claim 2, wherein the electrical circuit further includes a first resistor.

4. The system of claim 3, wherein the capacitor and resistor of the electrical circuit are connected in parallel.

5. The system of claim 4, wherein the electrical circuit further includes a second resistor connected in series with the capacitor.

6. The system of claim 1, wherein the electrical circuit includes a pulse generator temporally synchronized with the pulsed power supply unit.

7. An excimer or molecular fluorine laser system, comprising:
   a discharge chamber containing a gas mixture;
   a first and a second spaced apart main discharge electrodes having a discharge area therebetween within the discharge chamber, the first main discharge electrode being maintained at ground potential;
   a pulsed power supply unit for applying electrical pulses to the second main discharge electrode for producing discharges between the first and second main discharge electrodes for energizing the gas mixture;
   a resonator for generating a laser beam;
   at least one preionization unit disposed within the discharge chamber for preionizing the gas mixture within the discharge area prior to application of the electrical pulses to the main discharge electrodes, the preionization unit including first and second preionization electrodes having a dielectric therebetween; and
   an electrical circuit coupled between the first preionization electrode and ground potential, said second preionization electrode being electrically connected to said second main discharge electrode, said electrical circuit being configured so that a potential difference applied across the first and second preionization electrodes is substantially less than is applied across the first and second main discharge electrodes by the electrical pulses supplied by the pulsed power supply unit, such that both over-flashing and electrical oscillations from residual energies stored in the dielectric are reduced;
   wherein the at least one preionization unit further includes a mesh electrode between the dielectric and the discharge area between the main discharge electrodes.

8. The system of any of claims 1–2 or 6, wherein the bushingless dielectric tube includes a cylindrical tube having a uniform outer diameter such that the preionization unit is of corona discharge type.

9. The system of claim 8, wherein the cylindrical tube includes an opening defined at both ends.

10. The system of claim 8, wherein the cylindrical tube comprises $Al_2O_3$.

11. The system of claim 2, wherein the bushingless dielectric tube includes a cylindrical tube having a uniform outer diameter, and wherein a capacitance of said dielectric tube is $C_0$ and a capacitance of said capacitor is between 0.10 $C_0$ and 1.25 $C_0$.

12. The system of claim 8, wherein the potential difference applied across the first and second preionization electrodes is between 10% and 125% of the potential difference applied across the first and second main discharge electrodes.

13. The system of claim 8, wherein the bushingless dielectric tube is longer than the first preionization electrode to further reduce over-flashing and electrical oscillations from residual energies stored in the bushingless dielectric tube.

14. The system of claim 1, wherein the bushingless dielectric tube is longer than the first preionization electrode to further reduce over-flashing and electrical oscillations from residual energies stored in the bushingless dielectric tube.

15. The system of claim 1, wherein the electrical circuit includes a resistor.

16. The system of claim 2, wherein a capacitance of said dielectric is $C_0$ and a capacitance of said capacitor is between $0.10\ C_0$ and $1.25\ C_0$.

17. The system of any of claims 1–2 or 6, wherein the potential difference applied across the first and second preionization electrodes is between 10% and 125% of the potential difference applied across the first and second main discharge electrodes.

18. A preionization system including at least one preionization unit for preionizing a gas mixture prior to main discharges of a gas discharge laser, the preionization unit comprising:
   a first preionization electrode;
   a second preionization electrode, said second preionization electrode being electrically connected to one of first and second main discharge electrodes of said laser which receives high voltage pulses from a main high voltage pulse generator circuit;
   a bushingless dielectric tube surrounding the first preionization electrode; and
   an electrical circuit coupled between the first preionization electrode and ground potential, such that a potential difference applied across the first and second preionization electrodes is substantially less than is applied across the first and second main discharge electrodes by the electrical pulses supplied by the main high voltage pulse generator circuit, such that both over-flashing and electrical oscillations arising from residual energies stored in the bushingless dielectric tube are reduced.

19. The system of claim 18, wherein the electrical circuit includes a capacitor.

20. The system of claim 19, wherein the electrical circuit further includes a first resistor.

21. The system of claim 20, wherein the capacitor and resistor of the electrical circuit are connected in parallel.

22. The system of claim 21, wherein the electrical circuit further includes a second resistor connected in series with the capacitor.

23. A preionization system including at least one preionization unit for preionizing a gas mixture prior to main discharges of a gas discharge laser, the preionization unit comprising:
   a first preionization electrode;
   a second preionization electrode;
   a dielectric between the first and second preionization electrodes; and
   an electrical circuit coupled between the first preionization electrode and ground potential, said second preionization electrode being electrically connected to one of first and second main discharge electrodes of said laser which receives high voltage pulses from a main high voltage pulse generator circuit, said electrical circuit being configured so that a potential difference applied across the first and second preionization electrodes is substantially less than is applied across the first and second main discharge electrodes by the electrical pulses supplied by the main high voltage pulse generator circuit, such that both over-flashing and electrical oscillations arising from residual energies stored in the dielectric are reduced;
   wherein the at least one preionization unit further includes a mesh electrode between the dielectric and the discharge area between the main discharge electrodes.

24. The system of any of claim 18–19, wherein the bushingless dielectric tube includes a cylindrical tube having a uniform outer diameter such that the preionization unit is of corona discharge type.

25. The system of claim 24, wherein the cylindrical tube includes an opening defined at both ends.

26. The system of claim 24, wherein the cylindrical tube comprises $Al_2O_3$.

27. The system of claim 24, wherein a capacitance of said capacitor is $C_0$ and a capacitance of said tube is between $0.10\ C_0$ and $1.25\ C_0$.

28. The system of claim 24, wherein the potential difference applied across the first and second preionization electrodes is between 10% and 125% of the potential difference applied across the first and second main discharge electrodes.

29. The system of claim 24, wherein the dielectric tube is longer than the first preionization electrode to further reduce over-flashing and electrical oscillations from residual energies stored in the dielectric.

30. The system of claim 18, wherein the dielectric is longer than the first preionization electrode to further reduce over-flashing and electrical oscillations from residual energies stored in the dielectric.

31. The system of claim 18, wherein the electrical circuit includes a resistor.

32. The system of claim 19, wherein a capacitance of said capacitor is $C_0$ and a capacitance of said tube is between $0.10\ C_0$ and $1.25\ C_0$.

33. The system of any of claims 18–19 or 24, wherein the potential difference applied across the first and second preionization electrodes is between 10% and 125% of the potential difference applied across the first and second main discharge electrodes.

34. An excimer or molecular fluorine laser system, comprising:
   a discharge chamber containing a gas mixture;
   a first and a second spaced apart main discharge electrodes having a discharge area therebetween within the discharge chamber, the first main discharge electrode being maintained at ground potential;
   a pulsed power supply unit for applying electrical pulses to the second main discharge electrode for producing discharges between the first and second main discharge electrodes for energizing the gas mixture;
   a resonator for generating a laser beam;
   at least one preionization unit disposed within the discharge chamber for preionizing the gas mixture within the discharge area prior to application of the electrical pulses to the main discharge electrodes, the preionization unit including first and second preionization electrodes and a bushingless dielectric tube surrounding the first preionization electrode; and
   electrical circuit means for electrically coupling with said preionization unit in a manner to reduce over-flashing at ends of said bushingless dielectric tube when electrical pulses are supplied to the first and second main discharge electrodes by the pulsed power supply unit.

35. An excimer or molecular fluorine laser system, comprising:
- a discharge chamber containing a gas mixture;
- a first and a second spaced apart main discharge electrodes having a discharge area therebetween within the discharge chamber, the first main discharge electrode being maintained at ground potential;
- a pulsed power supply unit for applying electrical pulses to the second main discharge electrode for producing discharges between the first and second main discharge electrodes for energizing the gas mixture;
- a resonator for generating a laser beam;
- at least one preionization unit disposed within the discharge chamber for preionizing the gas mixture within the discharge area prior to application of the electrical pulses to the main discharge electrodes, the preionization unit including first and second preionization electrodes and a bushingless dielectric tube surrounding the first preionization electrode; and
- electrical circuit means for electrically coupling with said preionization unit in a manner to reduce electrical oscillations from residual energies stored in the dielectric when electrical pulses are supplied to the first and second main discharge electrodes by the pulsed power supply unit.

36. An excimer or molecular fluorine laser system, comprising:
- a discharge chamber containing a gas mixture;
- a first and a second spaced apart main discharge electrodes having a discharge area therebetween within the discharge chamber, the first main discharge electrode being maintained at ground potential;
- a pulsed power supply unit for applying electrical pulses to the second main discharge electrode for producing discharges between the first and second main discharge electrodes for energizing the gas mixture;
- a resonator for generating a laser beam;
- at least one preionization unit disposed within the discharge chamber for preionizing the gas mixture within the discharge area prior to application of the electrical pulses to the main discharge electrodes, the preionization unit including first and second preionization electrodes having a dielectric therebetween; and
- electrical circuit means for electrically coupling with said preionization unit in a manner to reduce over-flashing at ends of said dielectric when electrical pulses are supplied to the first and second main discharge electrodes by the pulsed power supply unit;
- the at least one preionization unit further including a mesh electrode between the dielectric and the discharge area between the main discharge electrodes.

37. The system of any of claims 34 or 35, wherein the bushingless dielectric tube includes a cylindrical tube having a uniform outer diameter such that the preionization unit is of corona discharge type.

38. The system of claim 37, wherein the dielectric is longer than the first preionization electrode to further reduce over-flashing and electrical oscillations from residual energies stored in the dielectric.

39. The system of any of claims 34 or 35, wherein the dielectric is longer than the first preionization electrode to further reduce over-flashing and electrical oscillations from residual energies stored in the dielectric.

40. A preionization system including at least one preionization unit for preionizing a gas mixture prior to main discharges of a gas discharge laser, the preionization unit comprising:
- a first preionization electrode;
- a second preionization electrode;
- a bushingless dielectric tube located about the first preionization electrode; and
- electrical circuit means for electrically coupling with said preionization unit in a manner to reduce over-flashing at ends of said dielectric when electrical pulses are supplied to first and second main discharge electrodes by a pulsed power supply unit of the gas discharge laser.

41. A preionization system including at least one preionization unit for preionizing a gas mixture prior to main discharges of a gas discharge laser, the preionization unit comprising:
- a first preionization electrode;
- a second preionization electrode;
- a bushingless dielectric tube located about the first preionization electrode; and
- electrical circuit means for electrically coupling with said preionization unit in a manner to reduce electrical oscillations from residual energies stored in the dielectric when electrical pulses are supplied to first and second main discharge electrodes by a pulsed power supply unit of the gas discharge laser.

42. A preionization system including at least one preionization unit for preionizing a gas mixture prior to main discharges of a gas discharge laser, the preionization unit comprising:
- a first preionization electrode;
- a second preionization electrode;
- a dielectric between the first and second preionization electrodes; and
- electrical circuit means for electrically coupling with said preionization unit in a manner to reduce over-flashing at ends of said dielectric when electrical pulses are supplied to first and second main discharge electrodes by a pulsed power supply unit of the gas discharge laser;
- the at least one preionization unit further including a mesh electrode between the dielectric and the discharge area between the main discharge electrodes.

43. The system of any of claims 40 or 41, wherein the bushingless dielectric tube includes a cylindrical tube having a uniform outer diameter such that the preionization unit is of corona discharge type.

44. The system of claim 43, wherein the dielectric is longer than the first preionization electrode to further reduce over-flashing and electrical oscillations from residual energies stored in the dielectric.

45. The system of any of claims 40 or 41, wherein the dielectric is longer than the first preionization electrode to further reduce over-flashing and electrical oscillations from residual energies stored in the dielectric.

46. An excimer or molecular fluorine laser system, comprising:
- a discharge chamber containing a gas mixture;
- a first and a second spaced apart main discharge electrodes having a discharge area therebetween within the discharge chamber, the first main discharge electrode being maintained at ground potential;

a pulsed power supply unit for applying electrical pulses to the second main discharge electrode for producing discharges between the first and second main discharge electrodes for energizing the gas mixture;

a resonator for generating a laser beam;

at least one preionization unit disposed within the discharge chamber for preionizing the gas mixture within the discharge area prior to application of the electrical pulses to the main discharge electrodes, the preionization unit including first and second preionization electrodes having a dielectric therebetween; and electrical circuit means for electrically coupling with said preionization unit in a manner to reduce electrical oscillations from residual energies stored in the dielectric when electrical pulses are supplied to the first and second main discharge electrodes by the pulsed power supply unit;

the at least one preionization unit further including a mesh electrode between the dielectric and the discharge area between the main discharge electrodes.

47. A preionization system including at least one preionization unit for preionizing a gas mixture prior to main discharges of a gas discharge laser, the preionization unit comprising:

a first preionization electrode;

a second preionization electrode:

a dielectric between the first and second preionization electrodes; and electrical circuit means for electrically coupling with said preionization unit in a manner to reduce electrical oscillations from residual energies stored in the dielectric when electrical pulses are supplied to first and second main discharge electrodes by a pulsed power supply unit of the gas discharge laser;

the at least one preionization unit further including a mesh electrode between the dielectric and the discharge area between the main discharge electrodes.

48. The system of claim 7, wherein the electrical circuit includes a capacitor.

49. The system of claim 7, wherein the electrical circuit includes a pulse generator temporally synchronized with the pulsed power supply unit.

50. The system of claim 23, wherein the electrical circuit includes a capacitor.

* * * * *